(12) United States Patent
Frankowsky

(10) Patent No.: US 6,717,870 B2
(45) Date of Patent: Apr. 6, 2004

(54) METHOD FOR ASSESSING THE QUALITY OF A MEMORY UNIT

(75) Inventor: Gerd Frankowsky, Höhenkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/185,282

(22) Filed: Jun. 27, 2002

(65) Prior Publication Data
US 2003/0002362 A1 Jan. 2, 2003

(30) Foreign Application Priority Data
Jun. 27, 2001 (DE) ......................................... 101 31 015

(51) Int. Cl.$^7$ ................................................ G11C 7/00
(52) U.S. Cl. ........................................ 365/200; 365/201
(58) Field of Search ................................ 365/200, 201, 365/230.03

(56) References Cited

U.S. PATENT DOCUMENTS

| 5,691,949 | A | * | 11/1997 | Hively et al. | ........... | 365/230.03 |
| 5,808,947 | A | * | 9/1998 | McClure | ...................... | 365/201 |
| 6,145,092 | A | | 11/2000 | Beffa et al. | ..................... | 714/7 |
| 6,285,610 | B1 | * | 9/2001 | Chun | ......................... | 365/200 |
| 6,414,890 | B2 | * | 7/2002 | Arimoto et al. | ............. | 365/201 |
| 6,434,063 | B1 | * | 8/2002 | Nishio et al. | ................ | 365/200 |
| 6,462,995 | B2 | * | 10/2002 | Urakawa | ..................... | 365/200 |

* cited by examiner

*Primary Examiner*—Trong Phan
(74) *Attorney, Agent, or Firm*—Laurence A. Greenberg; Werner H. Stemer; Ralph E. Locher

(57) ABSTRACT

Assessing the burn-in of faulty memory units on a wafer includes detecting only those defective memory cells that lie along control lines in the case of which the total number of defective memory cells does not exceed a predetermined limit value. With such a quality criterion, it is also possible to monitor the burn-in of faulty memory units on a wafer.

31 Claims, 4 Drawing Sheets

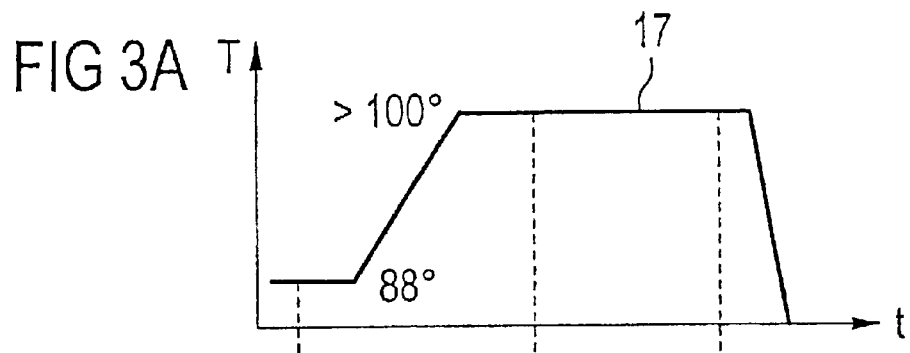
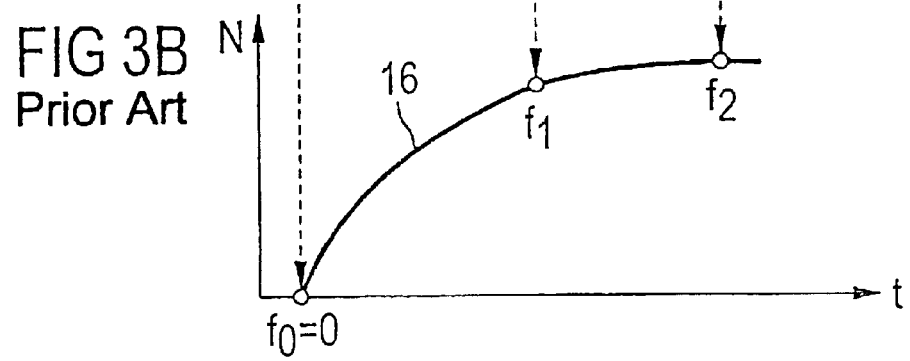
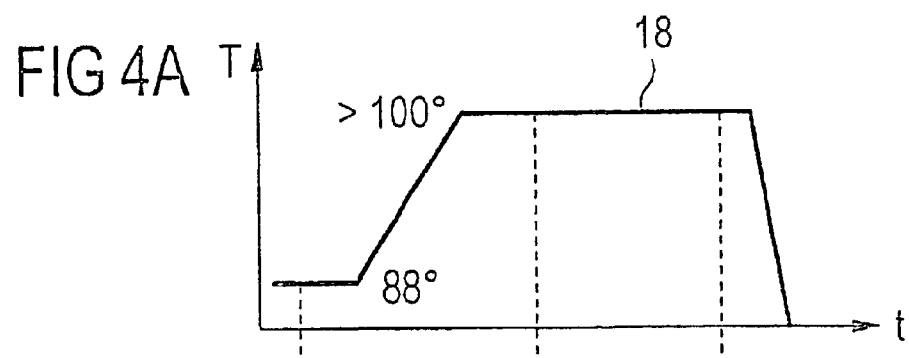
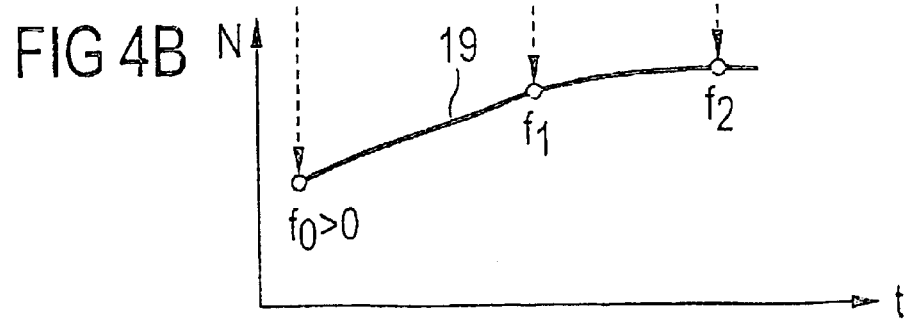

METHOD FOR ASSESSING THE QUALITY OF A MEMORY UNIT

BACKGROUND OF THE INVENTION

FIELD OF THE INVENTION

The invention relates to a method for assessing the quality of a memory unit having a multiplicity of memory cells, in which the memory cells are addressed through word lines running in one direction and bit lines running in another direction and the defective memory cells are detected.

Such methods are generally known and are used for testing the memory units, which are generally memory chips, with regard to their function. In such a case, these methods are employed in various stages of the production process. It is customary, e.g., for the function of the memory units to be tested and, if appropriate repaired while still on a wafer. Afterward, the wafers are usually separated to form individual memory chips and the memory chips are introduced into the housing. In a further method step, the finished memory devices are subjected to a thermal treatment, also referred to as "burn-in". During this, the memory devices are also exposed to electrical stress and tested in the process. The memory devices are thereupon tested at the specified speed at different temperatures. The memory components are subsequently mounted on circuit boards. This produces memory modules that are tested anew prior to delivery.

One disadvantage of the prior art methods is that the memory unit has to be tested at least three times before delivery. The first time, the memory units are tested on the wafer with regard to their function. The second test is carried out with the finished memory devices, and, finally, the finished memory modules are tested.

SUMMARY OF THE INVENTION

It is accordingly an object of the invention to provide a method for assessing the quality of a memory unit that overcomes the hereinafore-mentioned disadvantages of the heretofore-known devices and methods of this general type and that effectively determines the quality of memory units.

With the foregoing and other objects in view, there is provided, in accordance with the invention, a method for assessing the quality of a memory unit having a multiplicity of memory cells, including the steps of addressing the memory cells through word lines running in one direction and bit lines running in another direction, detecting defective ones of the memory cells, determining a number of word lines and/or bit lines for each word line and/or bit line in which a number of defective memory cells exceeds a limit value, and determining a number of defective memory cells along further ones of the word and/or bit lines running in the same direction for each word and/or bit line in which the number of defective memory cells is at most equal to the limit value.

The number of word lines or bit lines is determined in the case where the number of defective memory cells exceeds a limit value, and that the number of defective memory cells along further lines of the word lines or bit lines that run in the same direction is determined in the case where the number of defective memory cells is at most equal to the limit value.

The method according to the invention makes it possible to assess the quality of a memory unit without having to repair all the memory cells prior to the thermal treatment. The advantage occurs because the method according to the invention excludes the case where an entire control line with the memory cells connected thereto slowly degrades during the thermal treatment. Consequently, only those memory cells along the control lines are assessed that are actually activated in the finished memory component. The degraded control lines need not, however, be used to assess the quality of the memory units because these are deactivated in the finished memory component. It suffices, therefore, to subject the memory units, without a prior test and without prior repairs, to a thermal treatment until the method according to the invention indicates a stable state, in order subsequently to carry out the required repairs.

In accordance with another mode of the invention, the memory unit is exposed to an elevated temperature and repeatedly written to and read from the memory cells while carrying out the addressing, detecting, and determining steps.

In accordance with a further mode of the invention, each of word and/or bit lines are serially checked one after the other and, after each complete check of one of the word and/or bit lines, the number of defective memory cells detected are compared with the limit value, and, where the number of defective memory cells detected exceeds the limit value, a line defect counter is incremented and, where the number of defective memory cells detected does not exceed the limit value, in a summer, the number of defective memory cells detected in the respective line checked is added to the already detected total number of defective memory cells.

In accordance with an added mode of the invention, there is used, for the limit value, a number less than a number of redundant ones of the bit lines.

In accordance with an additional mode of the invention, there is used, for the limit value, a number less than a number of redundant ones of the word lines.

In accordance with yet another mode of the invention, before the temperature is elevated, a functional test is carried out without repairing elements identified as defective.

In accordance with yet a further mode of the invention, after the temperature is elevated, a repair of defective memory cells is carried out by redundant elements.

In accordance with yet an added mode of the invention, after the temperature is elevated, a repair of defective memory cells is carried out using redundant memory cells.

In accordance with a concomitant mode of the invention, after the temperature is elevated, a repair of defective memory cells is carried out using at least one of redundant word lines, redundant bit lines, and redundant memory cells.

Other features that are considered as characteristic for the invention are set forth in the appended claims.

Although the invention is illustrated and described herein as embodied in a method for assessing the quality of a memory unit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from-the following description of specific embodiments when read in connection with the accompanying drawings.

BRIEF DESCRIPTION OF THE DRAWINGS

FIG. 3A is a graph of a fault curve for a prior art thermal treatment;

FIG. 3B is a graph of a temperature profile for the prior art thermal treatment;

FIG. 4A is a graph of a temperature profile according to the invention;

FIG. 4B is a graph of a total number of faults during the thermal treatment is plotted according to the invention;

DESCRIPTION OF THE PREFERRED EMBODIMENTS

Figure 1:
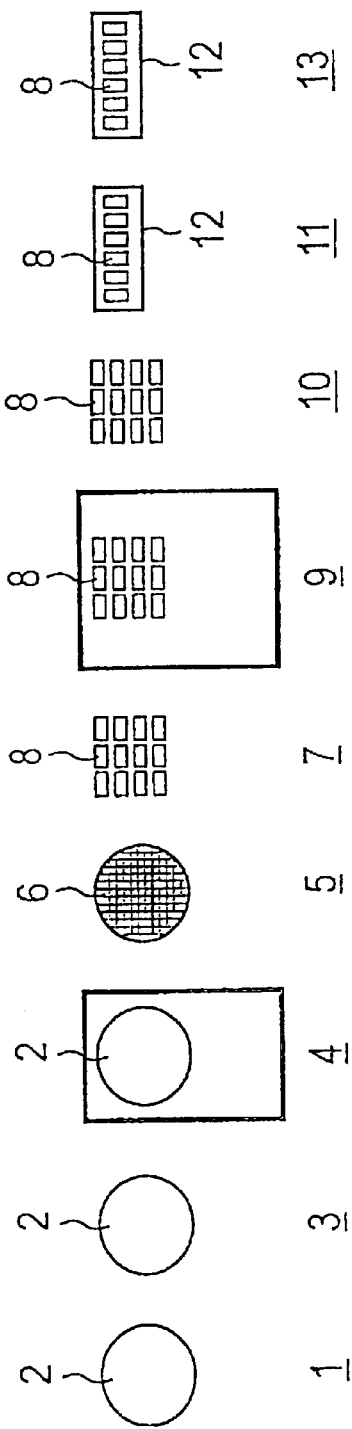
FIG. 1 is an illustration of a prior art test sequence.

Referring now to the figures of the drawings in detail and first, particularly to FIG. 1 thereof, there is shown a sequence of a conventional method for quality inspections. At the beginning there is the parameter detection 1 of a wafer 2, followed by a functional test 3 that detects defective memory cells on the wafer 2. Then, there is a repair 4 of the defective memory cells. In such a case, word lines or bit lines that are connected to memory cells that have been ascertained as defective are replaced by redundant word lines or bit lines with redundant memory cells. By sawing 5, memory chips 6 are, thereupon, separated and processed in the subsequent mounting 7 to form memory devices 8 by bonding the memory chips 6 on a respective lead frame and being introduced into a housing. This is followed by a burn-in 9, in the course of which the memory devices 8 are heated to temperatures greater than 100° C. and a data pattern that checks maximal loading is applied to the memory cells and the latter are tested. After the cooling of the memory devices 8, further tests 10 are carried out in which the memory chips 6 are operated with the specified operating frequency and alternating-temperatures. In the further course of events, the assembly 11 to form memory modules 12 is effected, which is followed by a further test 13 of the finished memory modules 12.

The conventional method described for quality inspection requires at least three tests, namely the functional test 3 and also the test 10 of the memory devices 8 after the burn-in and the further test 13 of the finished memory modules 12. Therefore, the conventional method described is laborious and time-consuming. Defects produced by the burn-in can no longer be repaired.

Figure 2:
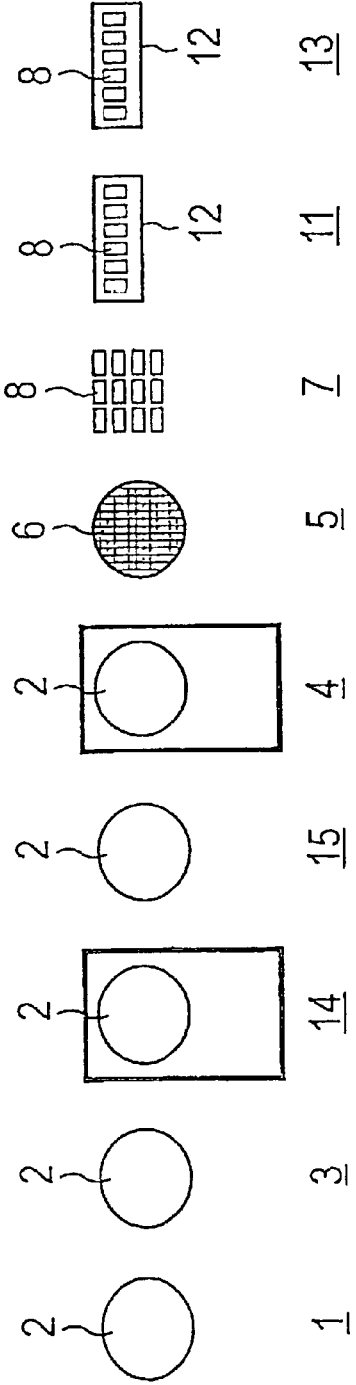
FIG. 2 shows an illustration of a test sequence in which the method according to the invention is employed.

By contrast, the improved method for quality inspection as illustrated in FIG. 2 manages with only three test steps, namely the functional test, the wafer-level burn-in, and a subsequent wafer-level test. The method according to the invention begins with the parameter detection 1 of the wafers 2 and is continued with the functional test 3. In contrast to the conventional method illustrated in FIG. 1, however, following is a burn-in 14 at the wafer level and a further test 15 in which the memory chips 6 are operated with the specified operating frequency and alternating temperatures. Only then do the repair 4 of the memory unit, the sawing up 5 of the memory chips, the mounting 7 of the memory devices 8 and also the assembly 11 of the memory modules 12 and the testing 13 of the finished memory modules 12 take place. Faults caused by the burn-in can now be repaired.

Specific difficulties occur, in particular, when carrying out. the burn-in 14. Such difficulties are explained with reference to FIGS. 3A and b and also FIGS. 4a and b.

In the conventional method according to FIG. 1, the wafer 2 is subjected to the repair 4 after the functional test 3. Therefore, fault-free memory devices 8 are present at the beginning of the burn-in 9. In the diagram illustrated in FIG. 3B, which illustrates the number N of faults against the time t of the burn-in 9, a fault curve 16 has the value zero at the beginning of the burn-in. A temperature profile 17 illustrated in FIG. 3A is traversed during the burn-in. At the same time, a data pattern that effects maximal loading of the memory cells of the memory devices 8 is stored in the memory device 8. Therefore, the fault curve 16 initially rises sharply and attains saturation after a certain time. The numbers $f_1$ and $f_2$ of faults plotted in FIG. 3B differ only little from one another in such a case.

In the method for quality inspection according to FIG. 2, a temperature profile 18 is likewise traversed that substantially corresponds to the temperature profile 17 of FIG. 3A. An associated fault curve 19 is illustrated in FIG. 4B. Because, during burn-in 14, the memory units corresponding to the memory chip 6 on the wafer 2 are not repaired, the curve 19 has a value greater than zero at the beginning of the burn-in 14.

Figure 5:
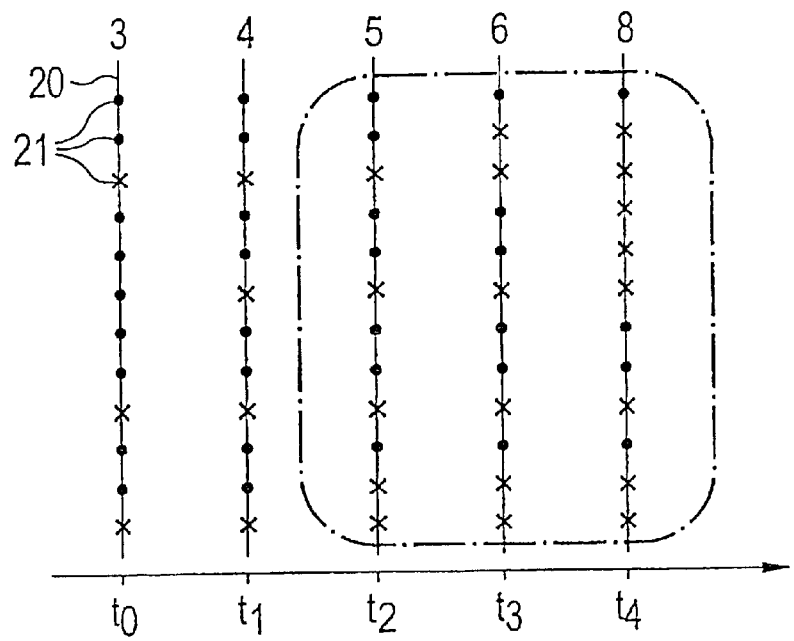
FIG. 5 is an illustration of a control line that varies with time during thermal treatment.

These facts are illustrated again with reference to FIG. 5. FIG. 5 illustrates a control line 20 by which memory cells 21 are driven. The control line 20 is a word or bit line. At an instant $t_0$, the word or bit line 20 has three defective memory cells, which are identified by small x symbols (the filled circles identifying fault-free memory cells 21). As can be discerned from FIG. 5, the number of defective memory cells 21 rises in each case by one at successive instants $t_1$ to $t_3$. From an instant $t_3$ to an instant $t_4$, however, the number of defective memory cells 21 increases abruptly by two defective memory cells 21 in each case. A word or bit line 20 along which such a large number of defective memory cells 21 is present must be deactivated and replaced by a corresponding redundant line of the same type. It suffices, therefore, to use those control lines 20 for assessing the quality of the memory chips 6 in the case of which the number of defective memory cells exceeds a lower limit value LL. The lower limit value is expediently chosen to be equal to the number of redundant control lines of the opposite type. If the line 20 is a word line, for example, the lower limit value LL for the maximum permissible number of defective memory cells 21 is chosen to be equal to the number of redundant bit lines. Conversely the number of redundant word lines is chosen for the lower limit value for the maximum permissible number of defective memory cells 21 if the line 20 is a bit line. In such a case, it is necessary to take account of restrictions to the effect that, due to a limited address space, redundant elements cannot replace arbitrary defective elements of the same type.

If, during the burn-in 14 both the number of defective memory cells 21 in the lines 20 is determined in the case where the number of defective memory cells is at most equal to the lower limit value and the number of those lines 20 is determined in the case where the number of defective memory cells 21 exceeds the lower limit value LL, it is possible to derive from the two numbers whether or not the burn-in 14 is in saturation. Ultimately, in the method described, the number of defective memory cells per usable word or bit line 20 is, thus, determined and used for assessing the saturation of the burn-in 14.

Figure 6:
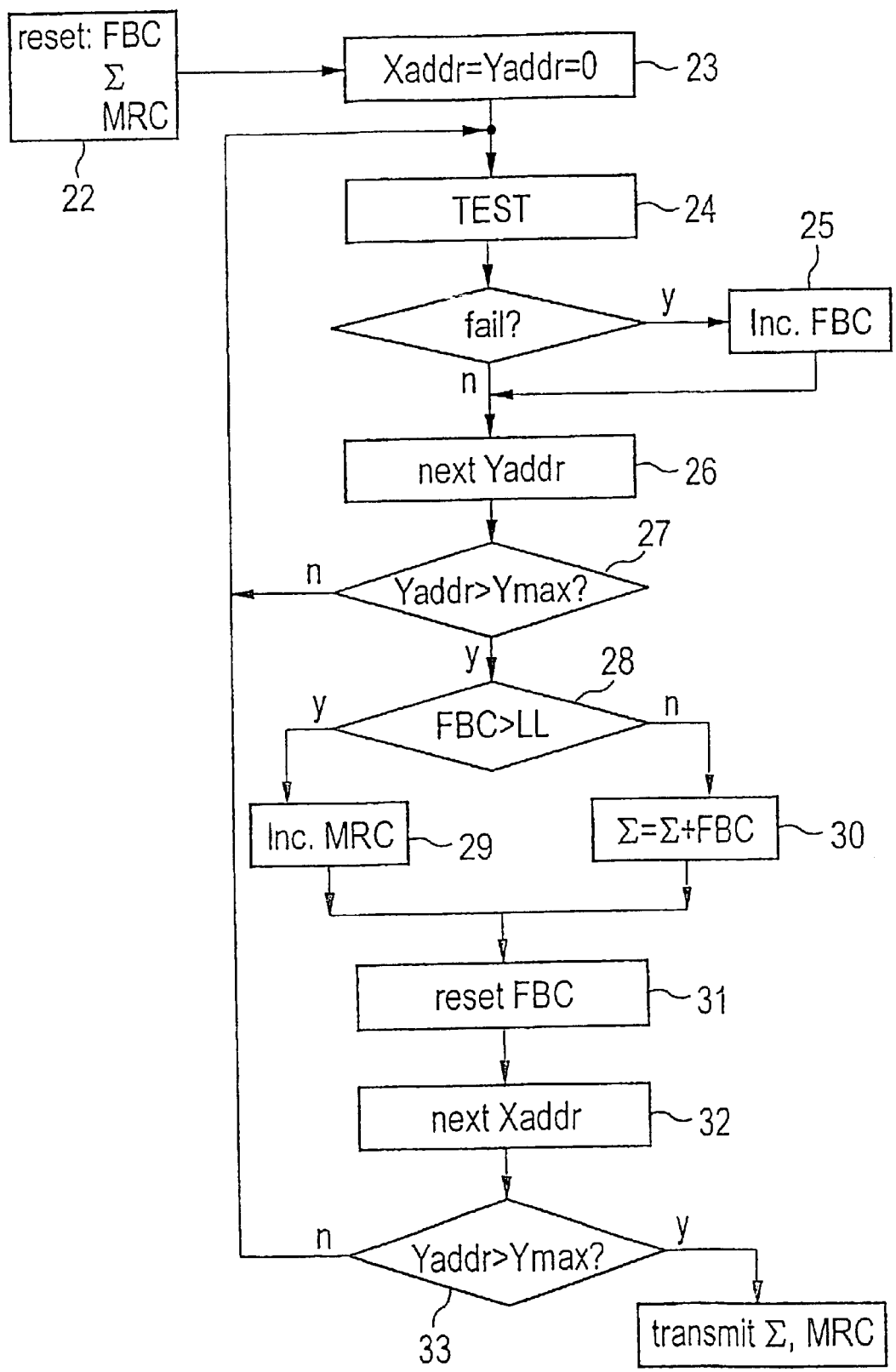
FIG. 6 is a flow chart illustrating a temporal sequence of the method according to the invention.

FIG. 6 is a flow diagram of a method for monitoring the burn-in 14 in the context of the method for quality inspection of the memory units as illustrated in FIG. 2.

At the beginning of the method, a line defect counter MRC ("Must Repair Counter"), and also a cell defect counter FBC ("Fail Bit Counter") and also a summer Σ are brought to zero by reset 22. This is followed by a reset 23 of the addresses of the memory cells 21. The first memory cell 21 is, thereupon, tested in a test step 24. If a defective memory cell 21 is involved, an increment 25 of the cell defect counter and an increment 26 of the cell address are effected. The increment 26 of the cell address is also effected if the memory cell 21 is fault-free. In such a case, however, an increment 25 of the cell defect counter FBC is not effected.

This is followed by an interrogation 27 that checks whether or not the cell address already exceeds the maximum cell address (Yaddr>Ymax?). If such is not the case, the test step 24 is carried out anew with the incremented cell address. Otherwise, a comparison 28 is made between the counter reading reached in the cell defect counter FBC and the lower limit value LL (FBC>LL). If the counter reading of the cell defect counter 25 exceeds the lower limit value LL, an increment 29 of the line defect counter NRC is effected. Otherwise, the counter reading reached in the cell defect counter FBC is added to the already detected number of defective memory cells 21. In a further method step, a reset 31 of the cell defect counter FBC is effected and an increment 32 of the line address is effected. If, in step 33, the line address is less than the maximum line address (Yaddr>Ymax?), the method jumps back to test step 24. Otherwise, the counter reading reached in the summer Σ and the line defect counter NRC is read out.

What is advantageous in the method according to the invention is that repair is effected only after the burn-in and faults produced by the burn-in are, therefore, corrected as well. The method, nevertheless, enables a reliable statement about the quality of the burn-in, even though faults ascertained during the burn-in may already have been present beforehand.

Figure 7:
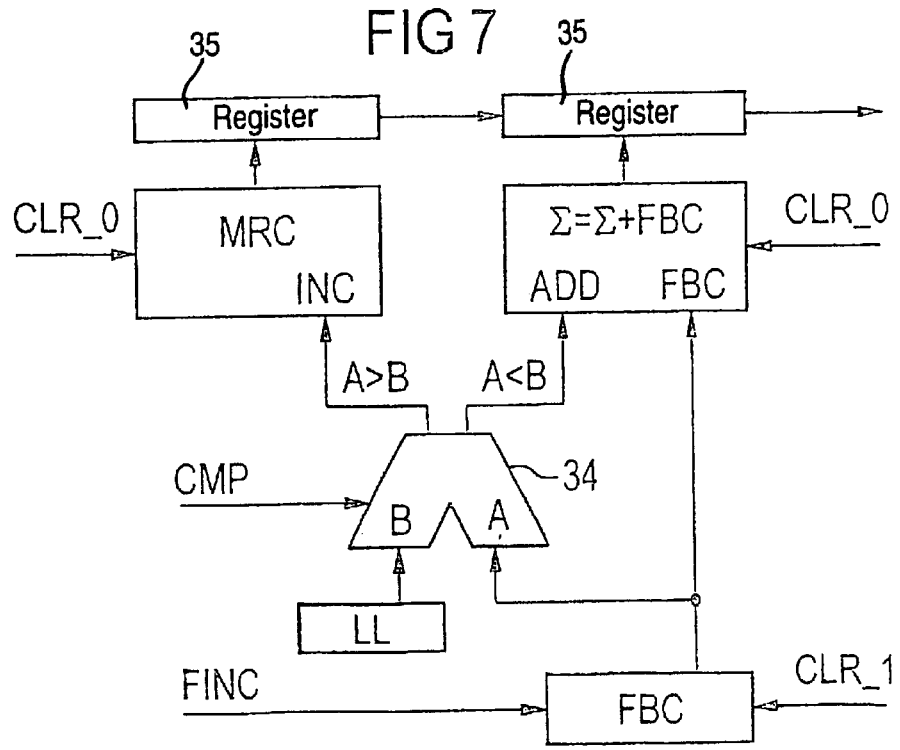
FIG. 7 is a block diagram for a circuit for carrying out the method according to the invention.

Finally, FIG. 7 illustrates a block diagram for the embodiment of the method described in FIG. 6. A non-illustrated evaluation logic unit outputs to the cell defect counter FBC (having a clear input CLR-1) a signal FINC that triggers the increment 25 of the cell defect counter FBC. A comparator 34 is connected downstream of the cell defect counter FBC, the lower limit value LL being applied to the other input of the comparator 34. When a signal CMP is input, the comparator 34 compares the lower limit value LL present at one of its inputs B with the counter reading reached in the cell defect counter FBC at the other one of its inputs A. If the counter reading of the cell defect detector FBC is greater than the lower limit value LL (A>B), the line defect counter MRC (having a clear input CLR-0) is incremented INC by the comparator 34. Otherwise (A<B), the addition (Σ=Σ+ FBC") in step 30) of the counter reading reached in the cell defect detector FBC to the total number of counted cell defects in the summer Σ (having a clear input CLR-0) is initiated by the comparator 34. After the conclusion of the method, the counter readings reached in the line defect counter MRC and in the summer Σ can be transmitted into the shift registers 35 and, from there, be read out serially.

The counter reading read out from the line defect counter MRC and the summer Σ can be used to assess whether or not saturation was reached during the burn-in 14 in the method for quality inspection according to FIG. 2. It is, thus, possible to manage merely with two test steps in the method illustrated in FIG. 2.

I claim:

1. A method for assessing the quality of a memory unit having a multiplicity of memory cells, which comprises:

addressing the memory cells through word lines running in one direction and bit lines running in another direction;

detecting defective ones of the memory cells;

determining a number of word lines for each word line in which a number of defective memory cells exceeds a limit value; and determining a number of defective memory cells along further ones of the word lines running in the same direction for each word line in which the number of defective memory cells is at most equal to the limit value.

2. The method according to claim 1, which further comprises exposing the memory unit to an elevated temperature and repeatedly writing to and reading from the memory cells while carrying out the addressing, detecting, and determining steps.

3. The method according to claim 1, which further comprises:

serially checking each of the word lines one after the other and, after each complete check of one of the word lines:

comparing the number of defective memory cells detected with the limit value; and where the number of defective memory cells detected exceeds the limit value, incrementing a line defect counter; and where the number of defective memory cells detected does not exceed the limit value, adding, in a summer, the number of defective memory cells detected in the respective line checked to the already detected total number of defective memory cells.

4. The method according to claim 2, which further comprises:

serially checking each of the word lines one after the other and, after each complete check of one of the word lines:

comparing the number of defective memory cells detected with the limit value; and where the number of defective memory cells detected exceeds the limit value, incrementing a line defect counter; and where the number of defective memory cells detected does not exceed the limit value, adding, in a summer, the number of defective memory cells detected in the respective line checked to the already detected total number of defective memory cells.

5. The method according to claim 1, which further comprises using, for the limit value, a number less than a number of redundant ones of the bit lines.

6. The method according to claim 1, which further comprises using, for the limit value, a number less than a number of redundant ones of the word lines.

7. The method according to claim 1, which further comprises using, for the limit value, a number less than a number of redundant bit lines.

8. The method according to claim 1, which further comprises using, for the limit value, a number less than a number of redundant word lines.

9. The method according to claim 2, which further comprises carrying out, before the temperature is elevated, a functional test without repairing elements identified as defective.

10. The method according to claim 9, which further comprises carrying out, after the temperature is elevated, a repair of defective memory cells by redundant elements.

11. The method according to claim 9, which further comprises carrying out, after the temperature is elevated, a repair of defective memory cells using redundant memory cells.

12. The method according to claim 9, which further comprises carrying out, after the temperature is elevated, a repair of defective memory cells using at least one of redundant word lines, redundant bit lines, and redundant memory cells.

13. A method for assessing the quality of a memory unit having a multiplicity of memory cells, which comprises:
   addressing the memory cells through word lines running in one direction and bit lines running in another direction;
   detecting defective ones of the memory cells;
   determining a number of lines for each line in which a number of defective memory cells exceeds a limit value; and
   determining a number of defective memory cells along further lines running in the same direction for each line in which the number of defective memory cells is at most equal to the limit value.

14. The method according to claim 13, which further comprises exposing the memory unit to an elevated temperature and repeatedly writing to and reading from the memory cells while carrying out the addressing, detecting, and determining steps.

15. The method according to claim 13, which further comprises:
   serially checking each of the lines one after the other and, after each complete check of one of the lines:
      comparing the number of defective memory cells detected with the limit value; and
      where the number of defective memory cells detected exceeds the limit value, incrementing a line defect counter; and
      where the number of defective memory cells detected does not exceed the limit value, adding, in a summer, the number of defective memory cells detected in the respective line checked to the already detected total number of defective memory cells.

16. The method according to claim 13, which further comprises using, for the limit value, a number less than a number of redundant ones of the lines.

17. The method according to claim 14, which further comprises carrying out, before the temperature is elevated, a functional test without repairing elements identified as defective.

18. The method according to claim 17, which further comprises carrying out, after the temperature is elevated, a repair of defective memory cells by redundant elements.

19. The method according to claim 17, which further comprises carrying out, after the temperature is elevated, a repair of defective memory cells using redundant memory cells.

20. A method for assessing the quality of a memory unit having a multiplicity of memory cells, which comprises:
   addressing the memory cells through word lines running in one direction and bit lines running in another direction;
   detecting defective ones of the memory cells;
   determining a number of bit lines for each bit line in which a number of defective memory cells exceeds a limit value; and
   determining a number of defective memory cells along further ones of the bit lines running in the same direction for each bit line in which the number of defective memory cells is at most equal to the limit value.

21. The method according to claim 20, which further comprises exposing the memory unit to an elevated temperature and repeatedly writing to and reading from the memory cells while carrying out the addressing, detecting, and determining steps.

22. The method according to claim 20, which further comprises:
   serially checking each of the bit lines one after the other and, after each complete check of one of the bit lines:
      comparing the number of defective memory cells detected with the limit value; and
      where the number of defective memory cells detected exceeds the limit value, incrementing a line defect counter; and
      where the number of defective memory cells detected does not exceed the limit value, adding, in a summer, the number of defective memory cells detected in the respective line checked to the already detected total number of defective memory cells.

23. The method according to claim 21, which further comprises:
   serially checking each of the bit lines one after the other and, after each complete check of one of the bit lines:
      comparing the number of defective memory cells detected with the limit value; and
      where the number of defective memory cells detected exceeds the limit value, incrementing a line defect counter; and
      where the number of defective memory cells detected does not exceed the limit value, adding, in a summer, the number of defective memory cells detected in the respective line checked to the already detected total number of defective memory cells.

24. The method according to claim 20, which further comprises using, for the limit value, a number less than a number of redundant ones of the bit lines.

25. The method according to claim 20, which further comprises using, for the limit value, a number less than a number of redundant ones of the word lines.

26. The method according to claim 20, which further comprises using, for the limit value, a number less than a number of redundant bit lines.

27. The method according to claim 20, which further comprises using, for the limit value, a number less than a number of redundant word lines.

28. The method according to claim 21, which further comprises carrying out, before the temperature is elevated, a functional test without repairing elements identified as defective.

29. The method according to claim 28, which further comprises carrying out, after the temperature is elevated, a repair of defective memory cells by redundant elements.

30. The method according to claim 28, which further comprises carrying out, after the temperature is elevated, a repair of defective memory cells using redundant memory cells.

31. The method according to claim 28, which further comprises carrying out, after the temperature is elevated, a repair of defective memory cells using at least one of redundant word lines, redundant bit lines, and redundant memory cells.

* * * * *